(12) United States Patent
Pelley

(10) Patent No.: US 8,611,128 B2
(45) Date of Patent: Dec. 17, 2013

(54) ROM MEMORY DEVICE

(75) Inventor: Perry H. Pelley, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 204 days.

(21) Appl. No.: 12/907,676

(22) Filed: Oct. 19, 2010

(65) Prior Publication Data

US 2012/0092917 A1   Apr. 19, 2012

(51) Int. Cl.
*G11C 17/00* (2006.01)

(52) U.S. Cl.
USPC ............................................ 365/94; 365/207

(58) Field of Classification Search
USPC .................................................. 365/94, 207
See application file for complete search history.

(56) References Cited

U.S. PATENT DOCUMENTS

| | | | |
|---|---|---|---|
| 5,438,547 A * | 8/1995 | Asami | 365/207 |
| 5,467,300 A | 11/1995 | Komarek et al. | |
| 6,285,590 B1 | 9/2001 | Poplevine et al. | |
| 2009/0086524 A1* | 4/2009 | Alam et al. | 365/94 |
| 2010/0207687 A1 | 8/2010 | Ramaraju et al. | |

OTHER PUBLICATIONS

Evans et al.; "An Experimental 512-bit Nonvolatile Memory with Ferroelectric Storage Cell"; Oct. 1988; pp. 1171-1175; vol. 23, No. 5; IEEE.
U.S. Appl. No. 12/853,106, filed Aug. 9, 2010.
U.S. Appl. No. 12/850,533, filed Aug. 4, 2010.

* cited by examiner

*Primary Examiner* — Jason Lappas
(74) *Attorney, Agent, or Firm* — David G. Dolezal; Daniel D. Hill

(57) ABSTRACT

A memory device includes a plurality of read only memory cells, a precharge circuit, and a sense amplifier. A read only memory (ROM) cell of the plurality of ROM cells is coupled to a word line and a bit line. The ROM cell comprises a transistor having a first current electrode coupled to receive a reference voltage, a second current electrode selectively coupled to the bit line based on the programmed state of the ROM cell, and a control electrode coupled to the word line. The precharge circuit is coupled to the bit line. The precharge circuit precharges the bit line to a precharge voltage, wherein the precharge voltage is less than the reference voltage. The sense amplifier is coupled to the bit line and to a power supply voltage terminal for receiving a power supply voltage, wherein the reference voltage is less than the power supply voltage.

19 Claims, 2 Drawing Sheets

ROM MEMORY DEVICE

BACKGROUND OF THE INVENTION

1. Field of the Invention

This invention relates to ROM memories.

2. Description of the Related Art

ROM memories include ROM memory cells that are utilized to permanently store data for electronic systems. With some types of ROM memory cells, a programmable element is programmed to store a logical 1 or logical 0 in a memory cell.

One type of ROM cell includes an NFET. The source terminal of the NFET is connected to ground, the drain terminal of the NFET is selectively coupled to a bit line via a programmable element, and the gate terminal of the NFET is connected to a word line. When the programmable element is in a programmed conductive state, the assertion of the word line generates a conductive path through the NFET to pull the bit line towards ground. When the programmable element is in a non conductive programmed state, the assertion of the word line does not generate a conductive path between the bit line and ground due to the programmable element being non conductive. Therefore, the bit line remains at a precharged voltage value when being read.

In another type of ROM cell, the drain terminal of an NFET is connected to VDD, the source terminal of the NFET is selectively coupled to a bit line via a programmable element, and the gate of the NFET is connected to a word line. When the programmable element is in a programmed conductive state, the assertion of the word line generates a conductive path through the NFET to pull the bit line towards VDD. When the programmable element is in a non conductive programmed state, the assertion of the word line does not generate a conductive path between the bit line and VDD due to the programmable element being non conductive. Therefore, the bit line remains at a precharged voltage value when being read.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a ROM memory device includes a plurality of ROM memory cells that during a read operation, selectively pull, based on the programmed states of the ROM cells, the bit lines towards a reference voltage that is less than VDD from a precharged lower voltage wherein a sense amplifier coupled to the bit line has an output that is precharged to VDD.

Figure 1:
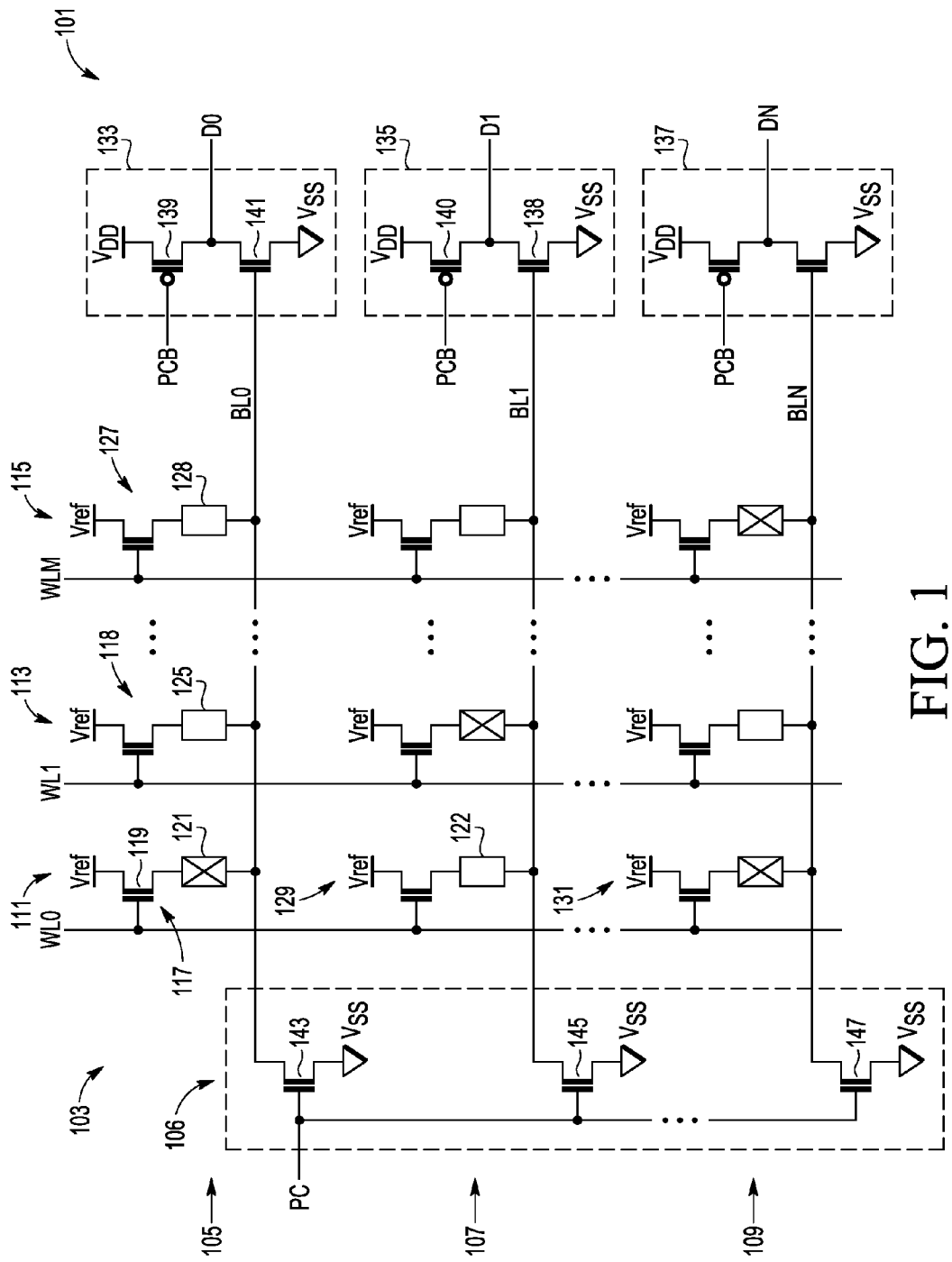
FIG. 1 is a circuit diagram of a ROM memory device according to one embodiment of the present invention.

FIG. 1 is a circuit diagram of a ROM memory device according one embodiment of the present invention. Memory device 101 includes an array 103 of ROM memory cells located in rows 111, 113, and 115, and columns 105, 107, and 109. Each row (111, 113, and 115) includes a number of memory cells coupled to a word line (WL0, WL1, WLM). For example, cells 117, 129, and 131 of row 111 each include a memory cell transistor (e.g. an NFET in the embodiment shown) having a control terminal (e.g. a gate in the embodiment shown) connected to word line 0 (WL0). For example, cell 117 includes a memory cell transistor 119.

Each column (105, 107, and 109) includes a plurality of cells coupled to a bit line (BL0, BL1, BLN). For example, cells 117, 118, and 127 are coupled to bit line BL0. In the embodiment shown, the source terminal of the memory cell transistor (e.g. 119) of each memory cell is selectively electrically coupled to the bit line via a programmable element (e.g. 121, 125, and 128) of the cell, depending upon the programmed state of the programmable element.

In the embodiment shown, array 103 is a 3×3 array. However, arrays of other embodiments may have a different number of rows and/or columns. In the view of FIG. 1, the rows are shown in a vertical orientation and the columns are shown in a horizontal orientation.

Each programmable element represents a structure or location whose characteristics are configurable to selectively store either a logical 1 or logical 0 in a memory cell depending upon the programmed state of the programmable element. Examples of programmable elements include fuses or anti fuses that have a programmed conductive state and a programmed non conductive state. A fused is a conductive structure that can be made non conductive in a post production process of the memory device (e.g. by a system manufacture). Another type of programmable element is a via location of an integrated circuit in which a conductive via is formed or not formed during production depending upon the value to be stored in the memory cell. In one embodiment, if the conductive via is formed, the source terminal of a memory cell transistor (e.g. 119) of a memory cell (e.g. 117) is electrically coupled to the bit line. In a non conductive programmed state, no conductive via would exist at the via location wherein the source terminal of the memory cell transistor (e.g. 119) is electrically isolated from the bit line. In another example, the programmable element may be a source region location of the memory cell transistor. In a conductive programmed state, the source region location is implanted with source dopants to store one logic value and in a non conductive programmed state, the source region location is not implanted to store another logic value. In other embodiments, the programmable element may be any structure of a memory cell that is present when one logical value is stored but is not present when the other logical value is stored. For example, the programmable element may be a contact location of the memory cell (e.g. a source contact, bit line contact, or gate contact) that is present when the memory cell is in one programmed state and not present when the memory cell is in an opposite programmed state.

Accordingly, in some embodiments, the programmable element has a first programmed state that provides a conductive path between Vref and the bit line when an asserted word line makes conductive the memory cell transistor and a second programmed state that is non conductive where the memory cell transistor is electrically isolated from the bit line even when the word line is asserted. Another ROM memory cells may have other configurations, may be operate in different manners, and/or may implement programmed states in different manner.

In the embodiment shown in FIG. 1, a programmable element with an "X" indicates that the programmable element is in a non conductive programmed state (e.g. a blown fuse, missing contact, missing source dopant). A programmable element without an "X" indicates that the programmable element is in a conductive programmed state. For example, programmable element 121 is in a non conductive programmed state and programmable element 125 is in a conductive programmed state.

The voltages of the word lines (WL0, WL1, and WLN) are provided by a memory controller of memory device 101 (not shown). In one embodiment, the asserted state voltage of the word lines is VDD and the unasserted state voltage is VSS. However, in other embodiments, the asserted state voltages and unasserted state voltages may be of different values. For example, the voltage of the unasserted state of the word line may be at a negative voltage with respect to VSS to more fully ensure turn off of the memory cell transistors. In one embodiment, the asserted state voltage of the word lines is at least a threshold voltage of a memory cell transistor (e.g. 119) above Vref. In other embodiments, the asserted state voltage of the word line is Vref.

In one embodiment, memory device 101 includes a voltage regulator (not shown) that provides Vref at lower voltage from VDD. In other embodiments, Vref is a power supply voltage that is lower than the power supply voltage VDD.

Device 101 includes a precharge circuit 106 for precharging the bit lines to VSS in between read operations. Precharge circuit 106 precharges the bit lines based on an assertion of a Precharge signal (PC). In one embodiment, the Precharge signal is provided by a memory controller (not shown). Precharge circuit 106 includes precharge transistors (NFETs 143, 145, and 147) each having a drain terminal connected to an associated bit line and a source terminal connected to a VSS (ground) terminal. The Precharge signal is asserted high to precharge the bit lines to VSS. In one embodiment, the Precharge signal has an asserted voltage of VDD and an unasserted voltage of VSS, but may have other asserted and/or unasserted voltage values in other embodiments. The Precharge signal is provided by a memory controller (not shown).

In the embodiment shown, each bit line (bit line 0, bit line 1, and bit line N) is connected to a sense amplifier (sense amplifier 133, 135, and 137, respectively). Each sense amplifier includes an output (e.g. D0, D1, DN) to provide a logic value indicative of the value read from the respective bit line during a read operation. In the embodiment shown, the voltage value state of the output of the sense amplifier is inverted from the voltage value state of the corresponding bit line during a read operation. For example, a low voltage on the bit line 0 during a read operation produces a high voltage on sense amplifier output D0.

Each sense amplifier (133, 135, and 137) includes a precharge transistor (139, 140) for precharging its sense amplifier output (D0, D1, and DN) between a read operation. For example, sense amplifier 133 includes a PFET precharge transistor 139 that has a source terminal connected to a VDD terminal. When transistor 139 is made conductive by the assertion (in a low voltage state) of the Precharge bar signal (which is a logical complement of the Precharge signal), the sense amplifier output (D0) is pulled to VDD. Each sense amplifier also includes a sense transistor (138, 141) that senses, amplifies, and inverts the voltage of the bit line connected to its gate. For example, transistor 141 senses, amplifies, and inverts the voltage on bit line BL0. In some embodiments, the sense transistors (e.g. 141) are bigger (e.g. have a larger effective gate width) than the memory cell transistors (e.g. 119) so as to provide a greater drive current.

In the embodiment shown, each bit line is connected to a corresponding sense amplifier. However, memory devices of other embodiments may include column decoders where multiple bit lines are coupled to a sense amplifier via a column multiplexer.

In one embodiment, Vref is greater than the threshold voltage of the sense transistors (e.g. transistors 141) by a predetermined voltage margin so as to make the sense transistors conductive during a read operation by the voltage on the bit lines selectively coupled to Vref via memory cells in the programmed conductive state. The predetermined voltage margin is based on factors such as desired memory speed, power savings, and manufacturing tolerances. For example, the higher the desired memory speed, the higher Vref is set. However, a lower Vref provides for a greater power savings in that the voltage of the bit lines is pulled to a lower voltage value (and therefore uses less power) during a read operation.

In embodiments where the asserted word line voltage state is Vref, an activated memory cell transistor is configured as a source follower. In such embodiments, Vref is higher than the sum of a voltage threshold of a sense transistor (e.g. 141) and the voltage threshold of a memory cell transistor (e.g. 119).

In the embodiment shown, VDD is at least higher than the sum of the threshold voltage of the sense transistor (e.g. 141) and the threshold voltage of a memory cell transistor (e.g. 119).

In one embodiment where the voltage threshold of the transistors is 0.5, VDD is 3 volts and Vref is 1.5 volts. However ever voltages may be used for VDD and Vref in other embodiments. In some embodiments, Vref is at least a voltage threshold of a memory cell transistor (e.g. 119) less than VDD.

Figure 2:
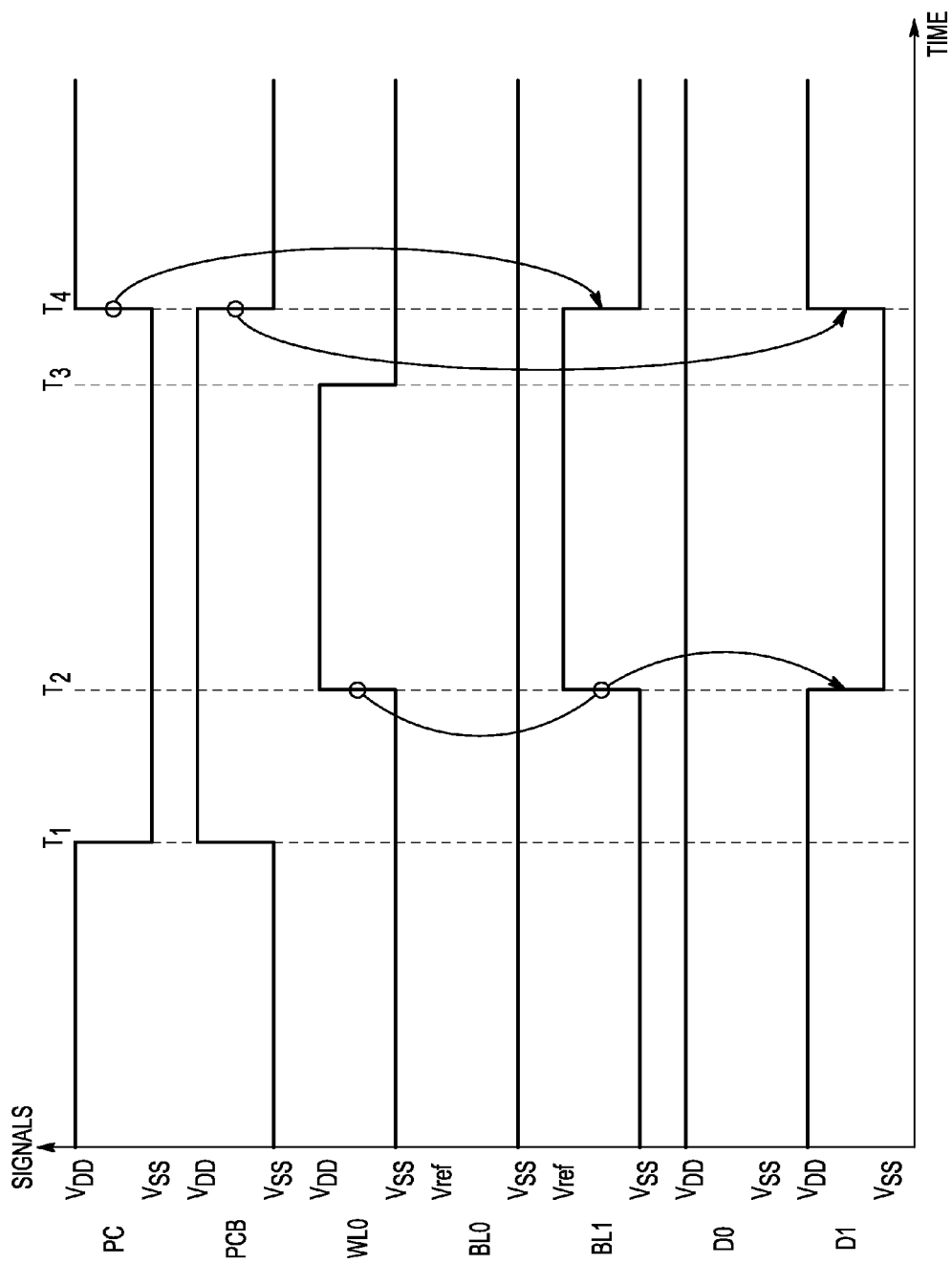
FIG. 2 is timing diagram showing a read operation of a ROM memory device according to one embodiment of the present invention.

FIG. 2 is a timing diagram showing a read operation of memory device 101 according to one embodiment of the present invention. Between read operations of memory array 103, the bit lines (BL0, BL1, and BLN) are precharged to VSS by the assertion of the Precharge signal (PC) at a high voltage asserted state (VDD), and the sense amplifier outputs (D0, D1, and DN) are precharged to VDD by the assertion of the Precharge bar signal (PCB) at a low voltage asserted state (VSS). See FIG. 2 at a time prior to time T1. During precharging, the word lines WL0, WL1, and WLM are at an unasserted voltage state (e.g. VSS in the embodiment of FIG. 2).

At time T1, the Precharge and Precharge bar signals are deasserted (are pulled to their non asserted voltage states). At time T2, the word line of the row of memory cells to be read (WL0 in FIG. 2) is asserted to VDD. The assertion of WL0 in FIG. 2 provides a voltage on the gates of the memory cell transistors (e.g. 119) to make the memory cell transistors conductive. For those memory cells of row 111 where the programmable element is in a conductive programmed state (e.g. cell 129), the memory cell transistor being conductive pulls the bit line coupled to the memory cell to Vref. See FIG. 2 where BL1 is pulled to Vref at time T2 due the assertion of WL0 by the memory cell transistor of cell 129 being conductive. For those cells (117 and 131) whose programmable element is in a non conductive programmed state, the assertion of WL0 at time T2 does not affect the bit lines coupled to those memory cells in that the memory cell transistors of those memory cells are electrically isolated from the bit lines by the non conductive programmable elements. See FIG. 2 showing bit line 0 remaining at VSS after time T2 even though word line 0 is asserted. Accordingly, during a read operation of row 111, bit line 0 and bit line 1 each reflect a different read value due to programmable element 121 of memory cell 117 and programmable element 122 of memory cell 129 having different programmed states.

The selective changing of the voltage levels of the bit lines during a read operation at time T2 causes the outputs of the sense amplifiers to selectively change voltage values accordingly. For example, bit line 1 transitioning to a high voltage at time T2 causes sense transistor 138 of sense amplifier 135 to become conductive to pull the voltage of output D1 from its precharged value VDD to VSS. For bit lines that did not change at time T2 (e.g. BL0), the voltage value of the corresponding sense amplifier output (e.g. output D0) does not change from the precharged value VDD due to those bit lines not being at a voltage to make the sense transistors (e.g. 141) of the corresponding sense amplifiers (e.g. 133) conductive.

At time T3, word line WL0 is deasserted (pulled back to VSS in the embodiment shown). At time T4, the Precharge (PC) signal is asserted (to VDD) to precharge the bit lines to VSS. See FIG. 2 wherein bit line bL1 is pulled back to VSS by the Precharge signal making conductive transistor 145. Also at time T4, the Precharge bar signal (PCB) is asserted to VSS to precharge the sense amplifier outputs (D0, D1, DN) to VDD. See FIG. 2 where the Precharge bar signal transitioning to a low voltage (VSS) causes precharge transistor 140 to become conductive to pull output D1 to VDD. The bit lines and sense amplifier outputs remain in the precharge state until the next read operation.

Providing a memory cell with a lower Vref voltage than the voltage provided to the sense amplifier (VDD) enables a ROM device to consume less power during a read operation in that the voltage swing of a bit line is reduced while allowing for the high voltage state of the sense amplifier to be at VDD. Providing a higher voltage (VDD) at the sense amplifier outputs enables the data read from ROM device 101 to be used by other higher voltage circuitry (not shown). Accordingly, such a ROM device uses less power than a ROM device whose cells are supplied with the same power supply voltage as supplied to the circuitry receiving the data from the sense amplifiers.

In one embodiment, a memory device includes a plurality of read only memory (ROM) cells. A ROM cell of the plurality of ROM cells is coupled to a word line and a bit line. The ROM cell includes a transistor. The transistor has a first current electrode coupled to receive a reference voltage, a second current electrode selectively coupled to the bit line based on a programmed state of the ROM cell, and a control electrode coupled to the word line. The memory device includes a precharge circuit coupled to the bit line. The precharge circuit is for precharging the bit line to a precharge voltage. The precharge voltage is less than the reference voltage. The memory device includes a sense amplifier coupled to the bit line. The sense amplifier is coupled to receive a power supply voltage. The reference voltage is less than the power supply voltage.

In another embodiment, a memory device includes a plurality of read only memory (ROM) cells. A ROM cell of the plurality of ROM cells is coupled to a word line and a bit line. The ROM cell includes a transistor and a programmable element. The transistor has a drain terminal coupled to a reference voltage terminal for receiving a reference voltage, a source terminal selectively coupled to the bit line based on a programmed state of the programmable element, and a gate terminal coupled to the word line. The memory device includes a precharge circuit coupled to the bit line. The precharge circuit is for precharging the bit line to a precharge voltage in response to a first control signal. The precharge voltage is less than the reference voltage. The memory device includes a sense amplifier coupled to the bit line. The sense amplifier includes a first transistor having a first current electrode coupled to a high power supply voltage terminal, a second current electrode coupled to an output terminal of the sense amplifier, and a control electrode coupled to receive a second control signal. The sense amplifier includes a second transistor having a first current electrode coupled to the output terminal of the sense amplifier, a second current electrode coupled to a low power supply voltage terminal, and a control electrode coupled to the bit line. The reference voltage is less than a high power supply voltage received at the high power supply voltage terminal.

Another embodiment includes a method for reading a read only memory (ROM) device. The method includes supplying a sense amplifier with a power supply voltage. The sense amplifier is coupled to a bit line. The method includes supplying a plurality of memory cells of the ROM device with a reference voltage. The reference voltage being less than the power supply voltage. The method includes precharging the bit line to a precharge voltage. The precharge voltage is less than the reference voltage. The method includes providing an asserted word line voltage on a selected word line and sensing a voltage on the bit line with the sense amplifier.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A memory device comprising:
   a plurality of read only memory (ROM) cells, a ROM cell of the plurality of ROM cells coupled to a word line and a bit line, the ROM cell comprising a transistor, the transistor having a first current electrode coupled to receive a reference voltage, a second current electrode selectively coupled to the bit line based on a programmed state of the ROM cell, and a control electrode coupled to the word line;
   a precharge circuit coupled to the bit line, the precharge circuit for precharging the bit line to a precharge voltage, wherein the precharge voltage is less than the reference voltage; and
   a sense amplifier coupled to the bit line, wherein the sense amplifier is coupled to receive a power supply voltage, and wherein the reference voltage is less than the power supply voltage.

2. The memory device of claim 1, wherein the precharge voltage is equal to a ground potential.

3. The memory device of claim 1, wherein the ROM cell further comprises a programmable element coupled between the second current electrode and the bit line, wherein the second current electrode is selectively coupled to the bit line based on a programmed state of the programmable element.

4. The memory device of claim 3, wherein the programmable element is one of either a contact location, via location, or source region location.

5. The memory device of claim 1, wherein the reference voltage is less than an asserted state voltage of the word line by at least a threshold voltage of the transistor of the ROM cell.

6. The memory device of claim 1, wherein the sense amplifier comprises:
   a precharging transistor having a first current electrode coupled to a power supply voltage terminal for receiving the power supply voltage, a second current electrode coupled to an output of the sense amplifier, and a control electrode for receiving a control signal; and a sensing transistor having a first current electrode coupled to the second current electrode of the precharging transistor, a second current electrode coupled to a terminal of the precharge voltage, and a control electrode coupled to the bit line.

7. The memory device of claim 6, wherein the transistor of the ROM cell has a first threshold voltage and the sensing transistor has a second threshold voltage, and wherein the power supply voltage is greater than or equal to the first threshold voltage plus the second threshold voltage.

8. The memory device of claim 6, wherein the sensing transistor has a threshold voltage, and wherein the reference voltage is greater than or equal to the threshold voltage.

9. The memory device of claim 1, wherein the sense amplifier comprises:
a precharging transistor having a first current electrode coupled to a power supply voltage terminal for receiving the power supply voltage, a second current electrode coupled to an output of the sense amplifier, and a control electrode for receiving a control signal, wherein the precharging transistor is for precharging the output of the sense amplifier to the power supply voltage.

10. A memory device comprising:
a plurality of read only memory (ROM) cells, a ROM cell of the plurality of ROM cells coupled to a word line and a bit line, the ROM cell comprising a transistor and a programmable element, the transistor having a drain terminal coupled to a reference voltage terminal for receiving a reference voltage, a source terminal selectively coupled to the bit line based on a programmed state of the programmable element, and a gate terminal coupled to the word line;
a precharge circuit coupled to the bit line, the precharge circuit for precharging the bit line to a precharge voltage in response to a first control signal, wherein the precharge voltage is less than the reference voltage; and
a sense amplifier coupled to the bit line, the sense amplifier comprising:
a first transistor having a first current electrode coupled to a high power supply voltage terminal, a second current electrode coupled to an output terminal of the sense amplifier, and a control electrode coupled to receive a second control signal; and
a second transistor having a first current electrode coupled to the output terminal of the sense amplifier, a second current electrode coupled to a low power supply voltage terminal, and a control electrode coupled to the bit line, wherein the reference voltage is less than a high power supply voltage received at the high power supply voltage terminal.

11. The memory device of claim 10, wherein the transistor of the ROM cell has a first threshold voltage and the second transistor has a second threshold voltage, and wherein an asserted state voltage of the word line is greater than or equal to the first threshold voltage plus the second threshold voltage.

12. The memory device of claim 10, wherein the second transistor has a threshold voltage, and wherein the reference voltage is greater than or equal to the threshold voltage.

13. The memory device of claim 10, wherein the programmable element is one of either a contact location, via location, or source region location.

14. The memory device of claim 10, wherein the precharge voltage is equal to a voltage of the low power supply voltage terminal.

15. The memory device of claim 10, wherein the output terminal of the sense amplifier is precharged to the high power supply voltage in response to the second control signal.

16. The memory device of claim 10, wherein the word line has an asserted voltage level equal to the high power supply voltage.

17. The memory device of claim 10, wherein the reference voltage is less than the high power supply voltage of the word line by at least a threshold voltage of the transistor of the ROM cell.

18. A method for reading a read only memory (ROM) device, the method comprising:
supplying a sense amplifier with a power supply voltage, the sense amplifier coupled to a bit line;
supplying a plurality of memory cells of the ROM device with a reference voltage, the reference voltage being less than the power supply voltage;
precharging the bit line to a precharge voltage, the precharge voltage being less than the reference voltage;
providing an asserted word line voltage on a selected word line; and
sensing a voltage on the bit line with the sense amplifiers;
wherein the sense amplifier includes a precharging transistor having a first current electrode coupled to a power supply voltage terminal for receiving the power supply voltage, the supplying the sense amplifier with a power supply voltage includes supplying the power supply voltage via the first current electrode, the precharging transistor having a second current electrode coupled to an output of the sense amplifier and a control electrode for receiving a control signal, wherein the precharging transistor is for precharging the output of the sense amplifier to the power supply voltage, the method further comprising asserting the control signal to precharge the output of the sense amplifier to the power supply voltage.

19. The method of claim 18, wherein precharging the bit line to the precharge voltage further comprises precharging the bit line to ground potential.

* * * * *